United States Patent
Yu et al.

(10) Patent No.: US 11,680,313 B2
(45) Date of Patent: Jun. 20, 2023

(54) SELECTIVE DEPOSITION ON NON-METALLIC SURFACES

(71) Applicant: Applied Materials, Inc., Santa Clara, CA (US)

(72) Inventors: Sang Ho Yu, Cupertino, CA (US); Lu Chen, Cupertino, CA (US); Seshadri Ganguli, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 288 days.

(21) Appl. No.: 16/866,974

(22) Filed: May 5, 2020

(65) Prior Publication Data
US 2020/0350204 A1 Nov. 5, 2020

Related U.S. Application Data

(60) Provisional application No. 62/865,665, filed on Jun. 24, 2019, provisional application No. 62/843,557, filed on May 5, 2019.

(51) Int. Cl.
*C23C 16/00* (2006.01)
*C23C 16/04* (2006.01)
*C23C 16/455* (2006.01)
*C23C 16/40* (2006.01)
*H01L 21/768* (2006.01)
*C23C 16/34* (2006.01)
*C23C 16/56* (2006.01)

(52) U.S. Cl.
CPC ............ *C23C 16/04* (2013.01); *C23C 16/042* (2013.01); *C23C 16/34* (2013.01); *C23C 16/403* (2013.01); *C23C 16/45525* (2013.01); *C23C 16/56* (2013.01); *H01L 21/76826* (2013.01); *H01L 21/76843* (2013.01); *H01L 21/76879* (2013.01)

(58) Field of Classification Search
CPC .......... C23C 16/00; H01L 21/00; H01L 23/00
See application file for complete search history.

(56) References Cited

U.S. PATENT DOCUMENTS 9,117,914 B1 8/2015 Ellinger et al.
11,094,535 B2 8/2021 Tois et al.
(Continued)

FOREIGN PATENT DOCUMENTS

JP 2016086145 A 5/2016
KR 20120037653 A 4/2012
(Continued)

OTHER PUBLICATIONS

Kuznetsov, Yu. I., et al., "Adsorption and passivation of copper by triazoles in neutral aqueous solution", Int. J. Corros. Scale Inhib., 2014, 3, No. 2, Mar. 13, 2014, 137-148.
(Continued)

*Primary Examiner* — Gordon Baldwin
*Assistant Examiner* — Mohammad Mayy
(74) *Attorney, Agent, or Firm* — Servilla Whitney LLC (57) ABSTRACT

Methods for selectively depositing on non-metallic surfaces are disclosed. Some embodiments of the disclosure utilize an unsaturated hydrocarbon to form a blocking layer on metallic surfaces. Deposition is performed to selectively deposit on the unblocked non-metallic surfaces. Some embodiments of the disclosure relate to methods of forming metallic vias with decreased resistance.

18 Claims, 5 Drawing Sheets

(56) References Cited

U.S. PATENT DOCUMENTS

| | | | |
|---|---|---|---|
| 2002/0192938 A1 | 12/2002 | Wada et al. | |
| 2006/0128150 A1* | 6/2006 | Gandikota | C23C 16/45525 257/E21.585 |
| 2009/0032766 A1 | 2/2009 | Rajaratnam et al. | |
| 2009/0104787 A1 | 4/2009 | Ohmi et al. | |
| 2009/0215269 A1 | 8/2009 | Boggs et al. | |
| 2009/0218693 A1 | 9/2009 | Lee | |
| 2011/0111556 A1 | 5/2011 | Chen et al. | |
| 2012/0052681 A1* | 3/2012 | Marsh | H01L 21/28562 438/763 |
| 2012/0077342 A1 | 3/2012 | Gao et al. | |
| 2016/0190060 A1* | 6/2016 | Bristol | H01L 21/76849 438/762 |
| 2017/0162511 A1 | 6/2017 | Ren et al. | |
| 2017/0323781 A1 | 11/2017 | Kachian et al. | |
| 2018/0061628 A1* | 3/2018 | Ou | H01L 21/32 |
| 2018/0082942 A1 | 3/2018 | Chawla | |
| 2018/0233350 A1* | 8/2018 | Tois | H01L 23/5226 |

FOREIGN PATENT DOCUMENTS

| | | |
|---|---|---|
| WO | 2019018379 A1 | 7/2018 |
| WO | 2019060413 A1 | 3/2019 |

OTHER PUBLICATIONS

PCT International Search Report and Written Opinion in PCT/US2020/031443 dated Aug. 12, 2020, 9 pages.

Chen, Xi, et al., "Divide and Protect: Passivating Cu(111) by Cu-(benzotriazole)2", The Journal of Physical Chemistry 2012, 116, Oct. 5, 2012, 222346-22349.

Farm, Elina , et al., "Passivation of copper surfaces for selective-area ALD using a thiol self-assembled monolayer", Semiconductor Science and Technology 27 (2012) 074004, Jun. 22, 2012, 5 pages.

Kokalj, Anton , et al., "Density Functional Theory Study of ATA, BTAH, and BTAOH as Copper Corrosion Inhibitors: Adsorption onto Cu(111) from Gas Phase", Langmuir 2010, 26 (18), Aug. 23, 2010, 14582-14593.

Kokalj, Anton , et al., "The Effect of Surface Geometry of Copper on Dehydrogenation of Benzotriazole. Part II", The Journal of Physical Chemistry 2014, 188, Dec. 12, 2013, 944-954.

Kokalj, Anton , et al., "What Determines the Inhibition Effectiveness of ATA, BTAH, and BTAOH Corrosion Inhibitors on Copper?", Journal of the American Chemical Society 2010, 132, Oct. 29, 2010, 16657-16668.

Peljhan, Sebastijan , et al., "The Effect of Surface Geometry of Copperon Adsorption of Benzotriazole and CI. Part I", The Journal of Physical Chemistry 2014, 118, Dec. 12, 2013, 933-943.

Pena, Luis Fabian, et al., "Vapor-Phase Cleaning and Corrosion Inhibition of Copper Films by Ethanol and Heterocyclic Amines", American Chemical Society: Applied Materials & Interfaces 2018, 10, Oct. 18, 2018, 38610-38620.

Non-Final Office Action in U.S. Appl. No. 16/701,061, dated Dec. 23, 2021, 11 pages.

Final Office Action in U.S. Appl. No. 16/701,061 dated Jul. 11, 2022, 16 pages.

\* cited by examiner

SELECTIVE DEPOSITION ON NON-METALLIC SURFACES

CROSS-REFERENCE TO RELATED APPLICATIONS

This application claims priority to U.S. Provisional Application No. 62/843,557, filed May 5, 2019, and U.S. Provisional Application No. 62/865,665, filed Jun. 24, 2019, the entire disclosures of which are hereby incorporated by reference herein.

TECHNICAL FIELD

Embodiments of the disclosure generally relate to methods for selective deposition on non-metallic surfaces. More particularly, some embodiments of the disclosure are directed to methods of selective deposition on non-metallic surfaces using blocking compounds comprising an unsaturated hydrocarbon. More particularly, some embodiments of the disclosure are directed to methods for selectively depositing a barrier layer on the surface of a dielectric material (e.g., SiOx, AlOx, etc.) over the surface of a conductive material followed by selective deposition of a film on the conductive material over the dielectric material and barrier layer.

BACKGROUND

In middle of the line (MOL) and back end of the line (BEOL) structures, barrier films are typically used between metal lines and dielectric layers to prevent diffusion and other adverse interactions between the dielectric and the metal lines. Yet the largest contribution to via resistance is mainly due to barrier films with high resistivity.

Current approaches have focused on reducing the barrier film thickness or finding barrier films with lower resistivity to decrease via resistance. However, increased via resistance as a result of barrier films remains an issue.

One approach has been to block or decrease the thickness of the barrier film on the metal surface at the bottom of the via while the thickness on the dielectric surface at the sidewalls remains. Since the barrier properties of the barrier film are required between the metal and the dielectric, this approach allows for the barrier film to remain intact, but the reduced thickness on the metal surface improves via resistance. These processes are referred to as selective deposition processes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor. Typically, selective deposition refers to the deposition of a film on a metal surface. A reverse selective deposition process deposits a film on the dielectric surface rather than the metal surface.

Accordingly, methods which allow for selective deposition on non-metallic (e.g. dielectric) surfaces are needed.

SUMMARY

One or more embodiments of the disclosure are directed to a method of forming a blocking layer. The method comprises exposing a substrate to an unsaturated hydrocarbon to selectively form a blocking layer on a first surface over a second surface. The substrate comprises a metallic material having the first surface and a non-metallic material having the second surface Additional embodiments of this disclosure relate to a method of selective deposition. The method comprises exposing a substrate comprising a metallic material having a first surface and a non-metallic material having a second surface, to an unsaturated hydrocarbon, to selectively form a blocking layer on the first surface over the second surface. The substrate is sequentially exposed to a metal precursor and a reactant to form a film on the second surface over the blocking layer on the first surface. The blocking layer is removed from the first surface.

Further embodiments of this disclosure relate to a method of forming low-resistance metal vias. The method comprises providing a substrate having a substrate surface with at least one feature formed therein. The at least one feature has a sidewall and a bottom. The sidewall comprises a non-metallic material surface. The bottom comprises a metallic material surface. The substrate is exposed to an unsaturated hydrocarbon to selectively form a blocking layer on the metallic material surface over the non-metallic material surface. The substrate is sequentially exposed to a metal precursor and a reactant to form a film on the non-metallic material surface over the blocking layer on the metallic material surface. The blocking layer is optionally removed from the metallic material surface. A conductive fill material is deposited within the at least one feature to form a low-resistance metal via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to methods for selectively forming a blocking layer on a metallic material surface. Some embodiments of the present disclosure further relate to methods for selectively depositing a film on a non-metallic material surface over a metallic material surface. Some embodiments of the present disclosure further relate to methods for forming metal vias with lower resistance.

Some embodiments of the disclosure advantageously provide methods for selectively forming a blocking layer on a metallic material surface.

As used in this specification and the appended claims, the phrase "metallic material surface" or "non-metallic material surface" refers to the surface of a metallic or non-metallic material, respectively. A non-metallic material, for the purposes of this disclosure, is any material that exhibits the properties of a poor conductor, or a good insulator. A non-metallic material may include metal atoms (e.g., tantalum nitride, titanium nitride) and still fall into the scope of non-metallic materials. In some embodiments, the terms "conductive material" and "dielectric material" are used in place of metallic material and non-metallic material, respectively.

As used in this specification and the appended claims, the term "selectively depositing on a first surface over a second surface", and the like, means that a first amount or thickness is deposited on the first surface and a second amount or thickness is deposited on the second surface, where the second amount or thickness is less than the first amount or thickness, or, in some embodiments, no amount is deposited on the second surface.

As used in this regard, the term "over" does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In some embodiments, "selectively" means that the subject material forms on the selected surface at a rate greater than or equal to about 2×, 3×, 4×, 5×, 7×, 10×, 15×, 20×, 25×, 30×, 35×, 40×, 45× or 50× the rate of formation on the non-selected surface. Stated differently, the selectivity of the stated process for the selected surface relative to the non-selected surface is greater than or equal to about 2:1, 3:1, 4:1, 5:1, 7:1, 10:1, 15:1, 20:1, 25:1, 30:1, 35:1, 40:1, 45:1 or 50:1.

In some embodiments, selective deposition comprises a combination of deposition and etch processes. For example, a barrier layer selectively deposited on a dielectric material over a conductive material may form a thin layer on the conductive material. A subsequent etch process, also referred to as a selective etch process, in some embodiments is used to remove the barrier layer from the conductive material at a faster rate than removal from the dielectric material to complete the selective deposition.

One or more embodiments of this disclosure are directed to methods of selectively forming a blocking layer on a first surface of a substrate over a second surface. The substrate comprises a metallic material (conductive material) with a first surface and a non-metallic material (dielectric material) with a second surface. In some embodiments, the first surface may be described as a metallic material surface or conductive material surface, and the second surface may be described as a non-metallic material surface or a dielectric material surface.

The metallic material of the substrate may be any suitable metallic material. In some embodiments, the metallic materials of this disclosure are conductive materials. Suitable metallic materials include, but are not limited to, metals, conductive metal nitrides, conductive metal oxides, metal alloys, silicon, combinations thereof and other conductive materials.

In some embodiments, the metallic material comprises one or more of chromium, manganese, iron, copper, nickel, cobalt, tungsten, ruthenium, molybdenum, tantalum or titanium. In some embodiments, the metallic material consists essentially of chromium, manganese, iron, copper, nickel, cobalt, tungsten, ruthenium, molybdenum, tantalum oxide, tantalum nitride, titanium oxide or titanium nitride. In some embodiments, the metallic material consists essentially of copper, cobalt, ruthenium, tungsten or molybdenum. In some embodiments, the metallic material comprises or consists essentially of silicon. As used in this specification and the appended claims, the term "consists essentially of" means that the material is greater than or equal to about 95%, 98% or 99% of the stated material on an atomic basis.

As used in this specification and the appended claims, the term "oxide" or the like means that the material contains the specified element(s). The term should not be interpreted to imply a specific ratio of elements. Accordingly, an "oxide" or the like may comprise a stoichiometric ratio of elements or a non-stoichiometric ratio of elements.

The non-metallic material of the substrate may be any suitable material. In some embodiments, the non-metallic materials of this disclosure are dielectric materials. Suitable non-metallic materials include, but are not limited to, silicon oxides (e.g. $SiO_2$), silicon nitrides, silicon carbides and combinations thereof (e.g. SiCON). Suitable non-metallic materials further include aluminum oxide, aluminum nitride and low-k dielectric materials. In some embodiments, the non-metallic material consists essentially of silicon dioxide ($SiO_2$). In some embodiments, the layer comprises silicon nitride. In some embodiments, the layer consists essentially of silicon nitride.

Figure 1:
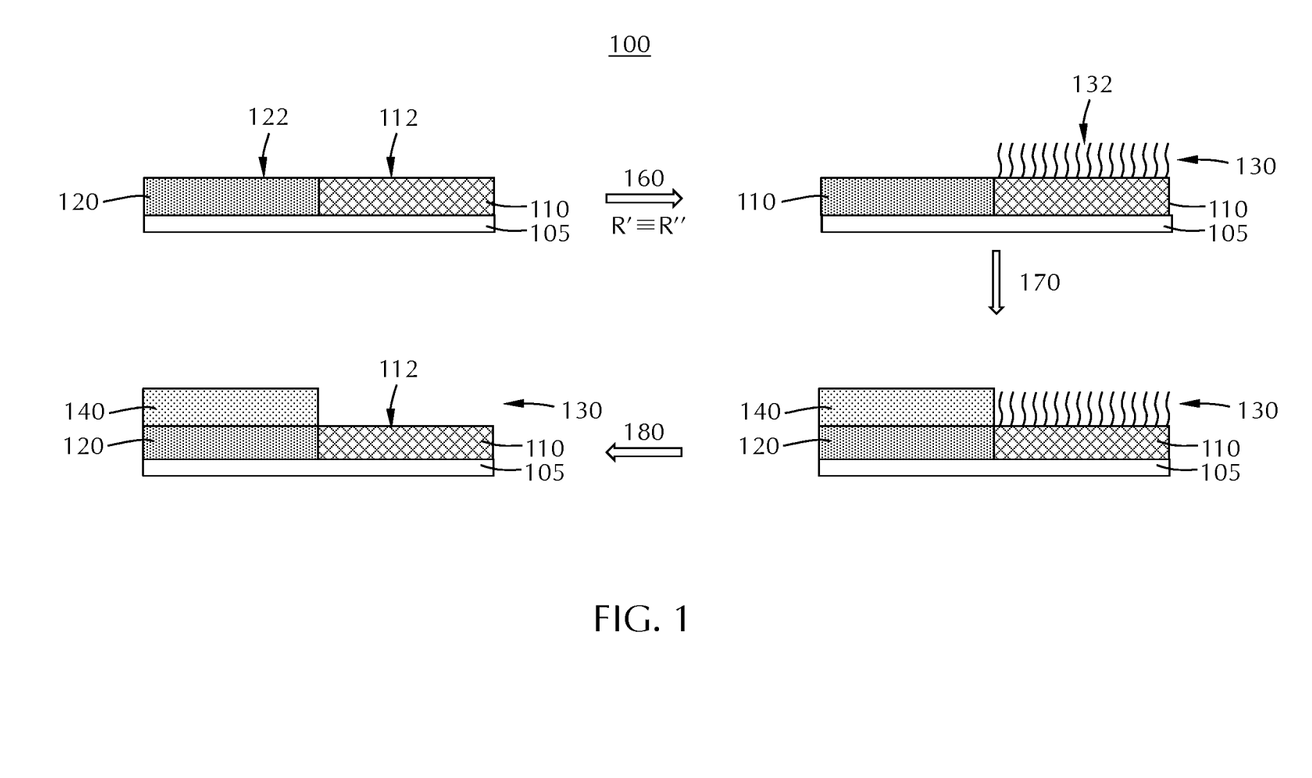
FIG. 1 illustrates a cross-sectional view of an exemplary substrate during processing according to one or more embodiment of the disclosure.

Referring to FIG. 1, an exemplary method 100 begins with a substrate 105 comprising a metallic material 110 having a first surface 112 and a non-metallic material 120 having a second surface 122. At operation 160, the substrate 105 is exposed to an unsaturated hydrocarbon (represented as R'≡R") to selectively form a blocking layer 130 on the first surface 112 over the second surface 122. As used in this manner, the phrase "the substrate is exposed to" means that the substrate as a whole, including the individual materials and layers thereon are exposed to the stated process or condition. In some embodiments, the surface of the blocking layer is described as a blocked first surface 132. The blocking layer 130 is illustrated in the Figures as a series of parallel wavy lines; however, the skilled artisan will recognize that this merely used as a generic representation and does not imply any particular morphology, density or structure of the blocking layer 130. The formation of the thin film of the blocking layer 130 may be considered a treatment process. Whereas the formation of thicker films are generally considered to be selective deposition.

Without being bound by theory, it is believed that the d-orbitals of the metallic materials start to share electrons with the $sp^2$ orbitals of the unsaturated hydrocarbon. Accordingly, in some embodiments, the unsaturated hydrocarbon comprises at least one compound with at least one double bond between two carbon atoms. In some embodiments, the unsaturated hydrocarbon comprises at least one compound with at least one triple bond between two carbon atoms. Stated differently, in some embodiments, the unsaturated hydrocarbon comprises at least one compound with a general formula of R'=R" or R'≡R". In some embodiments, the compound of the unsaturated hydrocarbon contains only one unsaturated bond. Without being bound by theory, it is believed that multiple unsaturated bonds increases the likelihood of polymerization and increases the difficulty of removing the blocking layer without damaging the surrounding substrate materials.

Further, without being bound by theory, it is believed that the unsaturated hydrocarbon (the blocking layer 130) suppresses one or more of the nucleation or growth rate of a subsequent film on the first surface 112.

In some embodiments, R' and R" are identical. In some embodiments, R' and R" are independent C2-C6 groups. As used in this regard, a "C2-C6 group" contains 2-6 carbon atoms. In some embodiments, R' and R" comprise only carbon and hydrogen atoms. In some embodiments, R' and R" do not comprises any surface reactive moieties. In some embodiments, the compound of the unsaturated hydrocarbon does not contain an unsaturated bond with a terminal carbon. In some embodiments, the compound of the unsaturated hydrocarbon comprises 4-12 carbon atoms. In some embodiments, R' and/or R" are linear molecules (e.g., a straight-chain unsaturated hydrocarbon). In some embodiments, R' and/or R" are branched. In some embodiments, the compound of the unsaturated hydrocarbon comprises or consists essentially of 3-hexyne. As used in this manner, the term "consists essentially of" means that greater than or equal to about 95%, 98%, 99% or 99.5% of the unsaturated hydrocarbon, on a molar basis, is the stated compound. In some embodiments, the compound of the unsaturated hydrocarbon comprises or consists essentially of 5-decyne.

In some embodiments, the substrate is soaked in a vapor of the unsaturated hydrocarbon. In some embodiments, the processing conditions for exposing the substrate to the unsaturated hydrocarbon may be controlled.

In some embodiments, the pressure of the processing chamber is controlled. The pressure of the processing chamber may be any suitable pressure for forming the blocking layer. In some embodiments, the pressure of the processing chamber is maintained at less than or equal to about 80 Torr, less than or equal to about 70 Torr, less than or equal to about 60 Torr, less than or equal to about 50 Torr, less than or equal to about 40 Torr, less than or equal to about 30 Torr, less than or equal to about 20 Torr, less than or equal to about 15 Torr, less than or equal to about 10 Torr, or less than or equal to about 5 Torr. In some embodiments, the pressure of the processing chamber is maintained at about 10 Torr, about 20 Torr, about 30 Torr, about 40 Torr, or about 50 Torr.

In some embodiments, the flow rate of the unsaturated hydrocarbon into the processing chamber is controlled. The flow rate of the unsaturated hydrocarbon may be any suitable flow rate for forming the blocking layer. In some embodiments, the flow rate of the unsaturated hydrocarbon is in a range of about 50 sccm to about 100 sccm, or in a range of about 75 sccm to about 100 sccm. In some embodiments, the flow rate of the unsaturated hydrocarbon is less than or equal to about 600 sccm, less than or equal to about 500 sccm, less than or equal to about 400 sccm, less than or equal to about 300 sccm, less than or equal to about 250 sccm, less than or equal to about 200 sccm, less than or equal to about 150 sccm, less than or equal to about 100 sccm, less than or equal to about 75 sccm, or less than or equal to about 50 sccm. In some embodiments, the flow rate of the unsaturated hydrocarbon is about 50 sccm or about 100 sccm.

In some embodiments, the soak period, during which the unsaturated hydrocarbon is exposed to the substrate, is controlled. The soak period may be any suitable period for forming the blocking layer. In some embodiments, the soak period is greater than or equal to about 10 s, greater than or equal to about 20 s, greater than or equal to about 30 s, greater than or equal to about 45 s, greater than or equal to about 60 s, greater than or equal to about 80 s, greater than or equal to about 120 s, greater than or equal to about 150 s, or greater than or equal to about 200 s. In some embodiments, the soak period is about 60 s. In some embodiments, the soak period is about 200 s.

In some embodiments, the temperature of the substrate is controlled during exposure to the unsaturated hydrocarbon. The temperature of the substrate may also be referred to as the operating temperature. In some embodiments, the temperature of the substrate is less than or equal to about 300° C., less than or equal to about 275° C., less than or equal to about 250° C., less than or equal to about 225° C., or less than or equal to about 200° C.

In some embodiments, the compound of the unsaturated hydrocarbon is a liquid at the operating temperature. In some embodiments, the compound of the hydrocarbon has a vapor pressure greater than or equal to about 0.1 Torr at the operating temperature.

In some embodiments, the method 100 continues at operation 170 with the deposition of a film 140 on the second surface 122 over the blocked first surface 132. The film 140 may be deposited by any technique known to the skilled artisan. The deposition of the film 140 on the non-metallic surface is referred to as "reverse selective deposition." The skilled artisan will understand that the term "selective deposition" is typically applied to the formation of a film on a metal surface, not a non-metallic surface. A reverse selective deposition process forms the film on the non-metallic surface.

In some embodiments, the film 140 is deposited by atomic layer deposition. In some embodiments, the film 140 is deposited by sequentially exposing the substrate 105 to a metal precursor and a reactant. In some embodiments, the film 140 comprises a metal nitride.

In some embodiments, the film 140 functions as a barrier film. In some embodiments, the film 140 comprises or consists essentially of titanium nitride. In some embodiments, the film 140 comprises or consists essentially of tantalum nitride. In some embodiments, the metal precursor comprises pentakis(dimethylamino)tantalum. In some embodiments, the reactant comprises ammonia. In some embodiments, the film 140 is formed without the use of plasma.

In some embodiments, at operation 180, the method 100 continues by removing the blocking layer 130 from the first surface 112. The blocking layer 130 may be removed by any suitable means, including but not limited to, plasma cleaning processes. In some embodiments, the substrate 105 is exposed to a plasma to remove the blocking layer 130 from the first surface 112. In some embodiments, the plasma comprises or consists essentially of one or more of argon (Ar), nitrogen ($N_2$) or hydrogen ($H_2$). As used in this specification, a plasma comprising nitrogen, hydrogen, oxygen, or the like, means a plasma formed from the molecular form of the species named. For example, a nitrogen plasma refers to a plasma ignited from molecular nitrogen ($N_2$). As used in this specification and the appended claims, an element-containing plasma (e.g., a nitrogen-containing plasma) refers to a compound that includes the element. For example, a nitrogen-containing plasma comprises or consists essentially of one or more compounds having nitrogen as an element (e.g., ammonia ($NH_3$)). In some embodiments, the plasma consists essentially of argon. In some embodiments, the plasma comprises or consists essentially of a mixture of $H_2$ and Ar.

In some embodiments, the mixture of $H_2$ and Ar has a ratio of $H_2$:Ar in a range of about 10:1 to about 1:10, in a range of about 10:1 to about 1:1, in a range of about 1:1 to about 1:10, in a range of about 5:1 to about 1:5, in a range of about 5:1 to about 1:1, in a range of about 1:1 to about 1:5, in a range of about 2:1 to about 1:2, in a range of about 2:1 to about 1:1, or in a range of about 1:1 to about 1:2. In some embodiments, the mixture of $H_2$/Ar is about 1:1.

The power of the plasma may be varied depending on the composition, packing and/or thickness of the blocking layer and composition and/or thickness of the surrounding materials. In some embodiments, the plasma power is in a range of about 20 W to about 500 W, in a range of about 20 W to about 400 W, in a range of about 20 W to about 250 W, in a range of about 50 W to about 500 W, in a range of about 100 W to about 500 W, in a range of about 100 W to about 450 W, in a range of about 100 W to about 500 W, or in a range of about 200 W to about 400 W. In some embodiments, the plasma power is about 50 W, about 200 W or about 400 W.

The duration of the plasma exposure may be varied depending on the composition, packing and/or thickness of the blocking layer 130 and composition and/or thickness of the surrounding materials. In some embodiments, the substrate is exposed to the plasma for a period in a range of about 2 s to about 60 s, in a range of about 3 s to about 30 s, or in a range of about 5 s to about 10 s. In some embodiments, the substrate is exposed to the plasma for a period of about 3 s, about 5 s, about 10 s or about 30 s.

Figure 2:
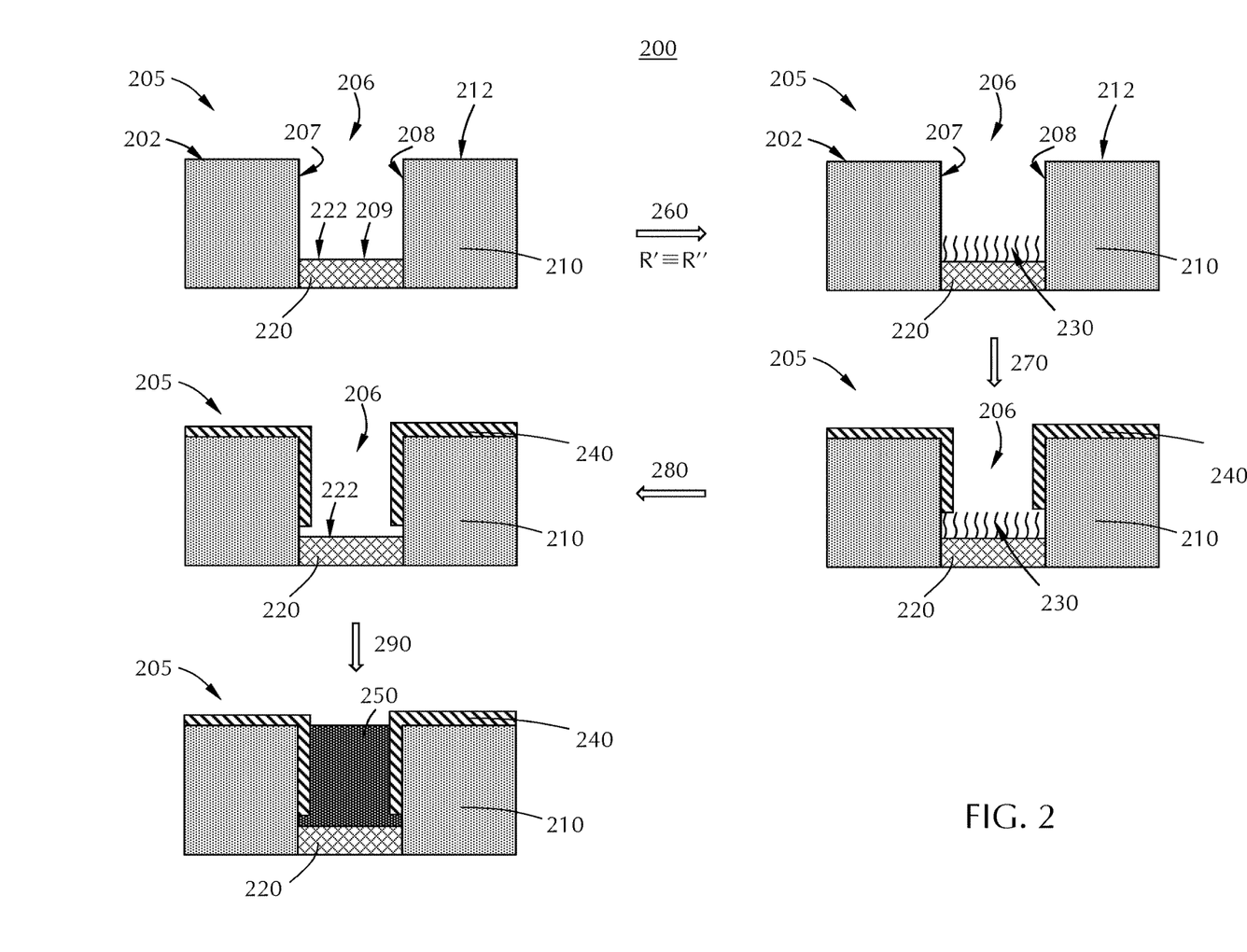
FIG. 2 illustrates a cross-sectional view of an exemplary substrate during processing according to one or more embodiment of the disclosure.

Referring to FIG. 2, an exemplary reverse selective deposition method 200 using a trench-like structure begins by providing a substrate 205 having a substrate surface 202 with at least one feature 206 formed therein. The different films and layers described are analogous to those of FIG. 1 and the skilled artisan will recognize that these are merely different structural forms of similar methods. The at least one feature 206 has sidewalls 207, 208 and a bottom 209. In the illustrated embodiment, the sidewalls 207, 208 comprise, and are formed by, a non-metallic material 210 surface. The bottom 209 comprises and is formed by a metallic material 220 surface. The at least one feature 206 may have one sidewall (e.g. a circular via), two sidewalls (e.g. a trench) or more sidewalls (e.g. square or polygonal via).

The method 200 continues at operation 260 by exposing the substrate 205 to an unsaturated hydrocarbon (represented by R'≡R") to selectively form a blocking layer 230 on the surface 222 of the metallic material 220 forming the bottom 209 of the feature 206 over the surface 212 of the non-metallic material 210 forming the substrate surface 202 and feature sidewalls 207, 208. Stated differently, the substrate 205 is treated with an unsaturated hydrocarbon to deactivate or block future deposition on the metallic material.

The method 200 continues at operation 270 by reverse selective deposition of film 240 on the non-metallic material 220 over the blocking layer 230. Again, the skilled artisan will understand that the term "reverse selective deposition" refers to a selective deposition process in which a film is formed on the dielectric or non-metallic surface. In some embodiments, the film 240 is deposited by sequentially exposing the substrate 205 to a metal precursor and a reactant. In some embodiments, the film 240 comprises a material that acts as a barrier layer.

The method 200, at optional operation 280, includes optionally removing the blocking layer 230 from the surface 222 of the metallic material 220 on the bottom 209 of the feature 206.

Without being bound by theory, it is believed that the blocking layer 230 increases the resistance of the conductive fill material 250 only marginally when compared to the increase in resistance typically seen with most barrier layers (e.g. film 240). Accordingly, the removal of the blocking layer 230 is an optional process which may further decrease the resistance of the conductive fill material 250.

Regardless of whether the blocking layer 230 is removed at operation 280, the method 200 continues at operation 290 by depositing a conductive fill material 250 within the at least one feature 206 to form a low-resistance metal via. In some embodiments, the low-resistance metal via has a resistance less than or equal to about 80% of a metal via formed without the blocking layer. Stated differently, the low-resistance metal vias formed by the disclosed process including the blocking layer 230 provide a via resistance reduction of greater than or equal to about 20%.

Figure 3:
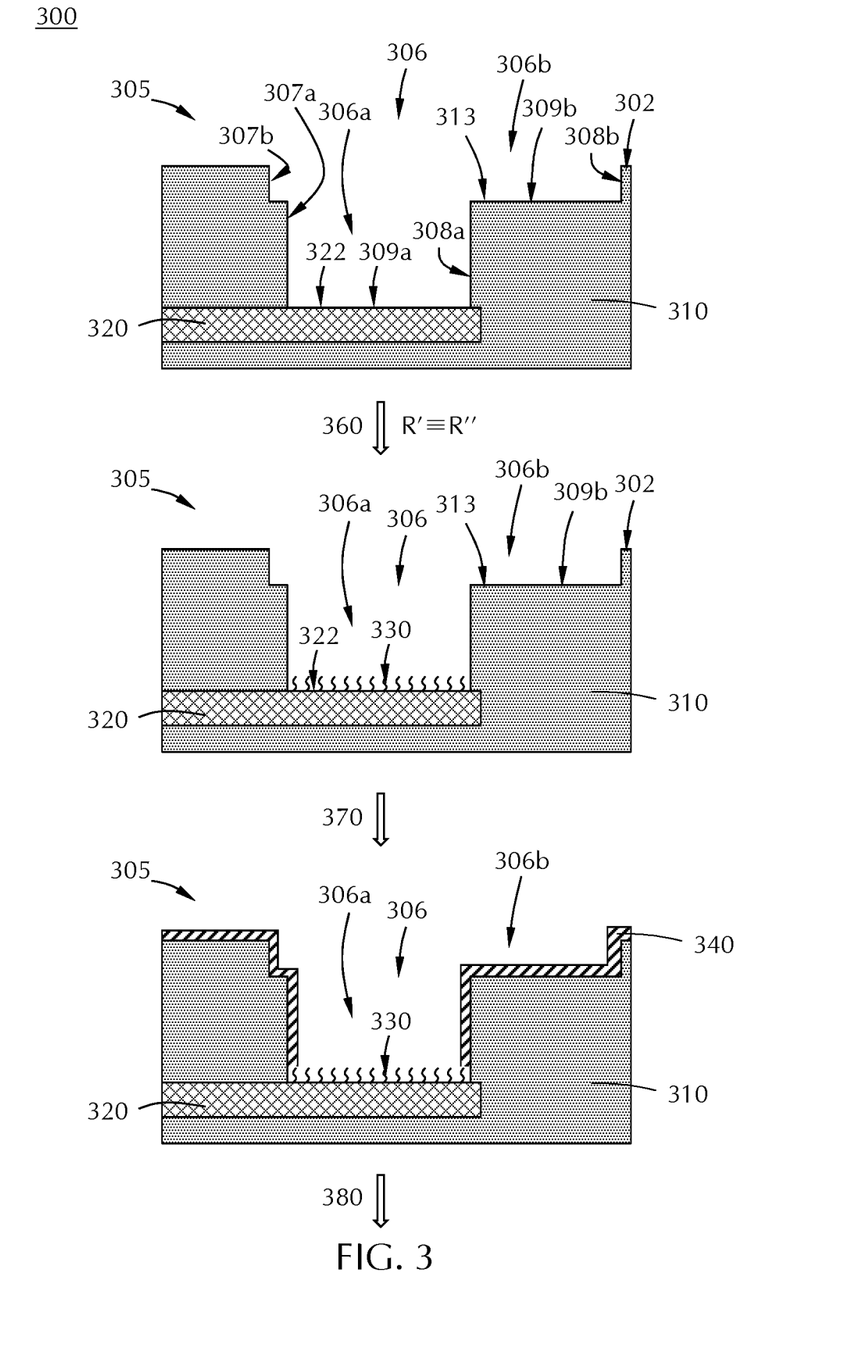
FIG. 3 illustrates a schematic cross-sectional view of an exemplary substrate during selective deposition according to one or more embodiment of the disclosure.

FIG. 3 illustrates another embodiment of the disclosure similar to both those shown in FIGS. 1 and 2. The method 300 shown in FIG. 3 occurs with the same materials and overall process as previously described. The embodiment illustrated in FIG. 3 is representative of a method 300 for the formation of a via connecting the $M_x$ and $M_{x+1}$ metal lines, as will be recognized by the skilled artisan. The method 300 begins with a substrate 305 having a dielectric material 310 and a conductive material 320. A feature 306 is formed in the substrate 305 with multiple tiers or levels. The feature 306 has lower portion 306a and an upper portion 306b. The lower section has sidewalls 307a, 308a and bottom 309a. The upper section has sidewalls 307b, 308b and bottom 309b. The sidewalls 307a, 307b, 308a, 308b are formed by the dielectric material 310. The bottom 309a of the lower portion 306a is formed by the surface 322 of the conductive material 320. The conductive material 320 is also referred to as the $M_x$ line. The bottom 309b is formed by the upper section surface 313 of the dielectric material 310.

At process 360, the substrate exposing the substrate 305 to an unsaturated hydrocarbon (represented by R'≡R") to selectively form a blocking layer 330 on the surface 322 of the conductive material 320 forming the bottom 309a of the lower portion 306a of the feature 306 over the surface of the dielectric material 310 forming the substrate surface 302, the sidewalls 307a, 307b, 308a, 308b and bottom 309b of the upper section surface 313 of the dielectric.

The method 300 continues at operation 370 by selectively depositing a film (barrier layer 340) on the dielectric material 310 over the blocking layer 330. As illustrated in FIG. 3, the barrier layer 340 is deposited selectively on the sidewalls 307a, 307b, 308a, 308b, bottom 309b of the upper section surface 313 of the dielectric and the substrate surface 302. The barrier layer 340 is deposited on the exposed dielectric material 310 surfaces and not on the conductive material 320. The barrier layer 340 can be deposited by any suitable technique known to the skilled artisan. In some embodiments, the barrier layer 340 is deposited by sequentially exposing the substrate 305 to a metal precursor and a reactant.

The method 300, at optional operation 380, includes optionally removing the blocking layer 330 from the surface 322 of the conductive material 320 on the bottom 309a of the lower portion 306a of the feature 306.

Regardless of whether the blocking layer 330 is removed at operation 380, the method 300 continues at operation 390 with a selective via deposition. A conductive via fill material 350 is deposited selectively within at least the lower portion 306a of the feature 306 to form a low-resistance metal via. In the illustrated embodiment, the conductive via fill material 350 is formed only in the lower portion 306a of the feature 306. However, the skilled artisan will recognize that the conductive fill material can be deposited to fill the entire feature 306 including the upper portion 306b. In some embodiments, the low-resistance metal via has a resistance less than or equal to about 80% of a metal via formed without the blocking layer. Stated differently, the low-resistance metal vias formed by the disclosed process including the blocking layer 330 provide a via resistance reduction of greater than or equal to about 20%.

In embodiments like that illustrated in FIG. 3 in which the conductive via fill material 350 is grown in a bottom-up manner to fill the via portion that makes up the lower portion 306a of the feature 306, a second conductive material is deposited in the upper portion 306b. For example, in operation 395 illustrated in FIG. 3, the upper portion 306b of the feature 306 is filled with a conductive material 355 to form the $M_{x+1}$ conductive line.

The conductive material 355 can be any suitable material known to the skilled artisan. In the illustrated embodiment, the conductive material 320 and the conductive material 355 are the same material, and the conductive via fill material 350 is a different material. For example, in some embodiments, the conductive material 320 and conductive material 355 comprise copper and the conductive via fill material 350 comprises cobalt. In some embodiments, the conductive via fill material 350 and the conductive material 355 are the same material. In some embodiments, the entire feature 306 is filled with a single material at one time to fill the lower portion 306a and upper portion 306b of the feature 306 in one process.

The conductive material 355 can be deposited by any suitable technique known to the skilled artisan. In some embodiments, the conductive material 355 is deposited by one or more of a chemical vapor deposition (CVD) process, an atomic layer deposition (ALD) process or a physical vapor deposition (PVD) process. In some embodiments, the conductive material 355 is deposited to overfill the feature 306 and form an overburden on the surface 302 of the substrate 305. The overburden is then removed by any suitable technique (e.g., etching, chemical-mechanical planarization (CMP)).

Figure 4:
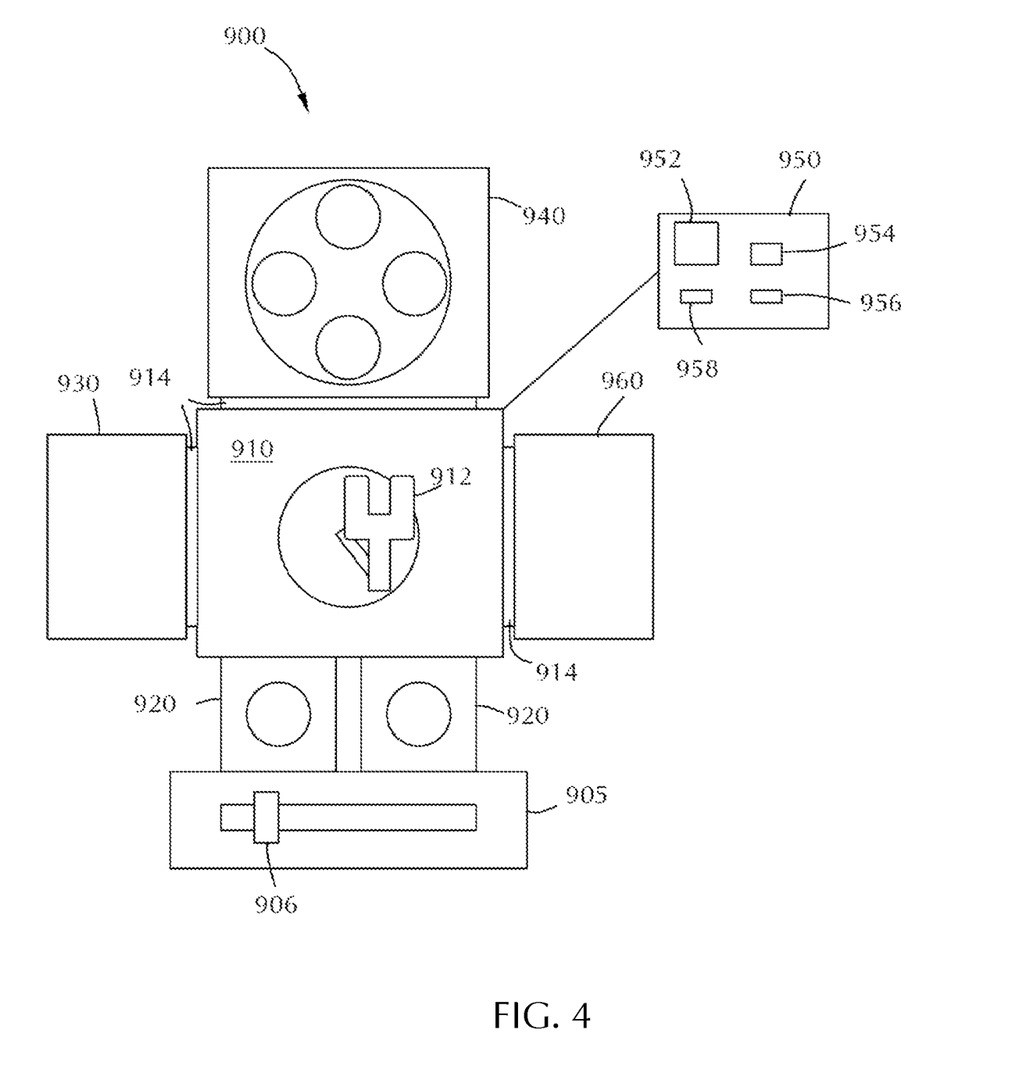
FIG. 4. illustrates an exemplary cluster tool according to one or more embodiment of the disclosure.

With reference to FIG. 4, additional embodiments of the disclosure are directed to a processing system 900 for executing the methods described herein. FIG. 3 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers 920, 930, 940, 960 connected to the central transfer station 910.

At least one pre-clean/buffer chamber 920 may be connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 3, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a deposition chamber for depositing a blocking layer and may be in fluid communication with one or more reactive gas sources to provide one or more flows of reactive gases to the first processing chamber 930. The substrate can be moved to and from the processing chamber 930 by the robot 912 passing through an isolation valve 914.

Processing chamber 940 can also be connected to the central transfer station 910. In some embodiments, processing chamber 940 comprises a film deposition chamber and is fluid communication with one or more reactive gas sources to provide flows of reactive gas to the processing chamber 940 to perform the deposition process. The substrate can be moved to and from the processing chamber 940 by robot 912 passing through an isolation valve 914.

In some embodiments, processing chamber 960 is connected to the central transfer station 910 and is configured to act as a conductive fill material deposition chamber. The processing chamber 960 can be configured to perform one or more deposition processes.

In some embodiments, each of the processing chambers 930, 940, and 960 are configured to perform different portions of the processing method. For example, processing chamber 930 may be configured to perform the blocking layer formation process, processing chamber 940 may be configured to perform the selective film deposition process, and processing chamber 960 may be configured to perform the conductive fill material formation process. The skilled artisan will recognize that the number and arrangement of individual processing chamber on the tool can be varied and that the embodiment illustrated in FIG. 3 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, and processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to selectively form a blocking layer; a configuration to selectively deposit a film on the second surface or in a surface feature; a configuration to remove the blocking layer; and/or a configuration to deposit a conductive fill material on the first surface or in a surface feature.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a blocking layer, the method comprising exposing a substrate comprising a metallic material having a first surface and a non-metallic material having a second surface to an unsaturated hydrocarbon to selectively form a blocking layer on the first surface over the second surface, the unsaturated hydrocarbon comprising at least one linear or branched compound with a general formula $R'{\equiv}R''$ where $R'$ and $R''$ are independent C2-C6 groups.

2. The method of claim 1, wherein $R'$ and $R''$ are identical.

3. The method of claim 1, wherein the at least one compound comprises 4-12 carbon atoms.

4. The method of claim 1, wherein the at least one compound contains only one unsaturated bond.

5. The method of claim 1, wherein the unsaturated hydrocarbon comprises 3-hexyne.

6. The method of claim 1, wherein the metallic material comprises one or more of copper, cobalt, tungsten, molybdenum or ruthenium.

7. The method of claim 1, wherein the non-metallic material comprises silicon oxide.

8. The method of claim 1, further comprising selectively depositing a film on the second surface over the blocking layer on the first surface.

9. The method of claim 8, wherein the film is deposited by sequentially exposing the substrate to a metal precursor and a reactant.

10. The method of claim 9, wherein the metal precursor comprises pentakis(dimethylamino)tantalum, the reactant comprises ammonia and the film comprises tantalum nitride.

11. The method of claim 1, further comprising exposing the substrate to a plasma to remove the blocking layer.

12. The method of claim 11, wherein the plasma consists essentially of argon.

13. A method of selective deposition, the method comprising:

exposing a substrate comprising a metallic material having a first surface and a non-metallic material having a second surface to an unsaturated hydrocarbon to selectively form a blocking layer on the first surface over the second surface, the unsaturated hydrocarbon comprising at least one linear or branched compound with a general formula R'≡R" where R' and R" are independent C2-C6 groups;

sequentially exposing the substrate to a metal precursor and a reactant to form a film on the second surface over the blocking layer on the first surface; and removing the blocking layer from the first surface.

14. The method of claim 13, wherein the unsaturated hydrocarbon comprises 3-hexyne.

15. A method of forming low-resistance metal vias, the method comprising:

exposing a substrate having a substrate surface with at least one feature formed therein to an unsaturated hydrocarbon to selectively form a blocking layer on a metallic material surface over a non-metallic material surface, the at least one feature having a sidewall and a bottom, the sidewall comprising a non-metallic material surface, the bottom comprising a metallic material surface, and the unsaturated hydrocarbon comprising at least one linear or branched compound with a general formula R'≡R" where R' and R" are independent C2-C6 groups;

sequentially exposing the substrate to a metal precursor and a reactant to form a film on the non-metallic material surface over the blocking layer on the metallic material surface;

optionally removing the blocking layer from the metallic material surface; and depositing a conductive fill material within the at least one feature to form a low-resistance metal via.

16. The method of claim 15, wherein the unsaturated hydrocarbon comprises 3-hexyne.

17. The method of claim 15, wherein the film comprises tantalum nitride.

18. The method of claim 15, wherein the low-resistance metal via has a resistance less than or equal to about 80% of a metal via formed without a blocking layer.

* * * * *